United States Patent [19]

Quick

[11] 4,287,466

[45] Sep. 1, 1981

[54] CONTROL CIRCUITRY FOR MAINTAINING FORWARD AND REFLECTED TRANSMISSION LINE POWER AT A PREDETERMINED SAFE LEVEL

[75] Inventor: Donald L. Quick, Mountain View, Calif.

[73] Assignee: The Perkin-Elmer Corporation, Norwalk, Conn.

[21] Appl. No.: 15,090

[22] Filed: Feb. 26, 1979

[51] Int. Cl.³ .............................................. G05F 1/66
[52] U.S. Cl. .................................. 323/275; 323/274; 323/280; 330/207 P; 455/117
[58] Field of Search .................... 323/17, 22 T, 23, 25; 361/18, 82, 84; 307/126, 127; 330/110, 112, 207 P; 455/117; 204/192, 298

[56] References Cited

U.S. PATENT DOCUMENTS

| | | |
|---|---|---|
| 3,641,451 | 2/1972 | Hollingsworth et al. ........ 330/207 P |
| 3,852,669 | 12/1974 | Bowman et al. .................. 330/207 P |
| 3,939,433 | 2/1976 | Okada et al. ...................... 330/110 X |
| 3,986,100 | 10/1976 | Beierholm et al. ..................... 323/17 |
| 4,122,400 | 10/1978 | Medendorp et al. ............ 455/117 X |

Primary Examiner—William M. Shoop
Assistant Examiner—Peter S. Wong
Attorney, Agent, or Firm—S. A. Giarratana; E. T. Grimes; T. P. Murphy

[57] ABSTRACT

Circuitry for controlling the power output of an R.F. generator for regulating the forward power transmitted into a load of varying impedance, such as an R.F. sputtering target, and for limiting reflected power to a safe predetermined level. Forward power is controlled by circuitry that compares the voltage across the target with a predetermined reference voltage and the amplified output is applied to the signal generator control circuitry. Reflected power is measured by a sensor that outputs a proportional D.C. signal that is compared with a predetermined threshold voltage. Whenever the reflected power signal exceeds this threshold, it removes the effect of the target voltage input signal so that the amplified control signal to the R.F. generator is a function only of the reflected power.

9 Claims, 2 Drawing Figures

CONTROL CIRCUITRY FOR MAINTAINING FORWARD AND REFLECTED TRANSMISSION LINE POWER AT A PREDETERMINED SAFE LEVEL

BRIEF SUMMARY OF THE INVENTION

This invention relates to electrical power regulation and particularly to a regulated power supply that drives an R.F. generator feeding into loads of varying impedances.

Typical applications for such a power supply include the provision of regulated D.C. power to cathode sputtering systems and for assuring that the bias voltages applied to a deposition target will remain constant during changing conditions that vary not only the load but also impedance characteristics that produce appreciable quantities of power to be reflected back from the load to the generator. Such reflected or reverse power results in excessive heat dissipation and eventual destruction of components.

Prior art regulating circuits developed to overcome the above-described problems make arbitrary amounts of reduction in forward R.F. power in response to sensed increases in reflected power from the load. Since reduced forward power also reduces the reflected power, these prior art regulators cause the energy to fluctuate or hunt until the fault is located and corrected. While these reflected power sensing regulators were a great advance in the art, they still failed to provide adequate and non-fluctuating regulation.

The regulator of the present invention is responsive to both the rectified R.F voltage applied across the load and to the reflected power sensed in the transmission line and adjusts the forward power to that level which causes only a fixed or limited amount of reflected power to be maintained. This method causes regulation of the reverse power; therefore, heat dissipation due to tuning losses will remain at a safe level and will provide a continuing reduction in forward power as losses increase because of deteriorating failure conditions.

Briefly described, the regulated power supply of the invention receives D.C. voltage signals proportional to both the R.F. voltage across the load and the reflected power determined by a power sensor in the R.F. transmission line. The signal representing voltage across the load is compared with one of a plurality of preselected D.C. reference signals representing the desired R.F. generator output and the compared signal controls a high voltage transistor that regulates the D.C. input power to the R.F. generator. However, when mismatch occurs in the load, the reflected power sensor generates an output signal which initiates a very smooth control takeover from the load voltage sensor. When the reflected power reaches a predetermined threshold level, the load voltage circuit no longer has control and the power supply output is held at a safe level determined by the reflected power sensor threshold until the mismatch begins to improve, at which time the reflected power will begin to decrease and the load voltage circuit will begin to dominate control of the R.F. generator output level.

DESCRIPTION OF THE DRAWINGS

In the drawings which illustrate a preferred embodiment of the invention.

DETAILED DESCRIPTION

Figure 1:
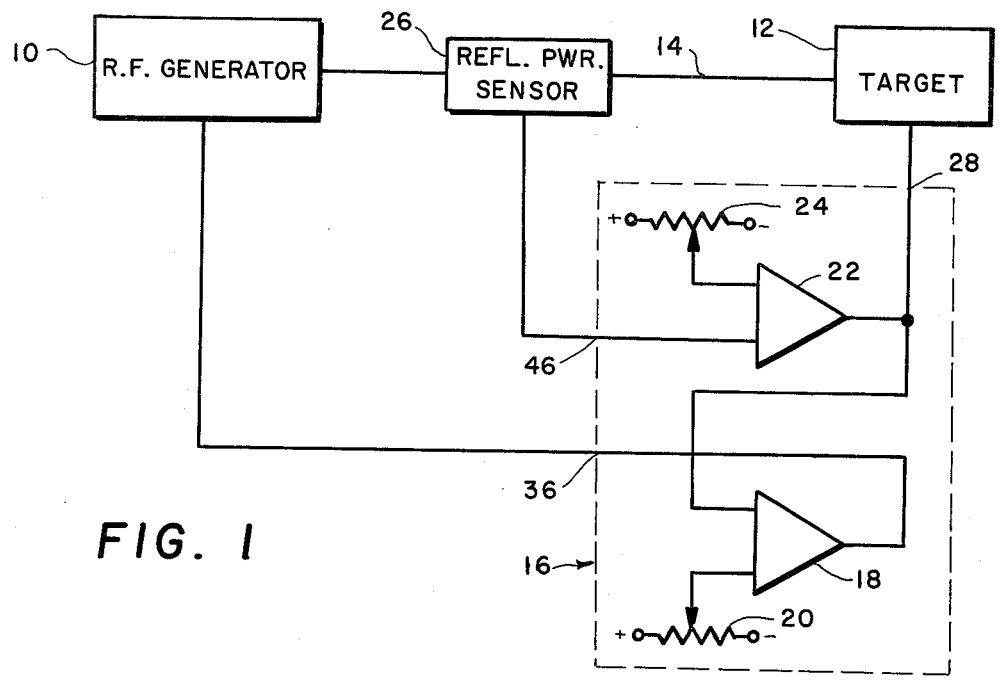
FIG. 1 is a schematic block diagram illustrating the power regulator of the invention coupled to an R.F. generator, transmission line reflected power sensor and the load.

Illustrated in the block diagram of FIG. 1 is an R.F. generator 10 which, in the preferred embodiment, is a type normally used for providing energy to a deposition target 12 in a cathode sputtering system. Large industrial types of sputtering systems require the generation of large quantities of R.F. energy for target voltages in the order of 1,500 volts. It is therefore apparent that the load impedances be properly matched with the generator for maximum energy transfer, and that any mismatch such as that which is caused by detuning of the circuitry in the sputtering head 12 will produce an appreciable quantity of energy to be reflected back through the transmission line 14 to cause overheating and probable damage to the various R.F. circuits. The circuitry of the invention assures that the voltage applied to the target 12 will remain at a constant amplitude during normal conditions of resonance and will also operate to reduce the power to the target 12 during periods of operation when the power reflected back toward the generator 10 begins to exceed a predetermined level.

The power regulation circuitry of the invention is illustrated in the dashed block 16 and, in its simplified form, comprises an operational amplifier 18 which receives a D.C. input signal representing the R.F. voltage applied across the target 12. The second input of amplifier 18 is coupled to a potentiometer 20 which provides a reference voltage representing the desired target voltage. Thus, in the absence of the additional circuitry to be subsequently described, the amplifier 18 will produce an output "error" signal which controls the D.C. power applied to the final R.F. amplifiers of the generator 10, and hence the output power of the R.F. generator, as a function of the rectified target voltage.

A second control of the output power of the R.F. generator 10 is provided by a second amplifier 22, one input terminal of which is coupled to a potentiometer 24 that provides a D.C. threshold voltage level representing the maximum desired or tolerated power that may be reflected from the target 12 during a condition of mismatch. The second input to the amplifier 22 is derived from a reflected power sensor 26 coupled into the transmission line 14 between the generator 10 and its load 12. Reflected power sensors, such as the sensor 26, are commercially available, one being manufactured and marketed by Bird Electronic Corporation of Cleveland, Ohio. The reflected power sensor 26 is adjusted to measure only reflected power and produces an output signal of 0–50 mV or more in its rated frequency and power range.

In operation, amplifier 18 normally controls the output, or forward power generated by the R.F. generator 10 into the load or target 12, as has previously been described. If detuning occurs to produce excessive reflected energy from target 12, the sensor 26 will produce a correspondingly increased D.C. output signal which is compared in the amplifier 22 with the preset limit determined by the potentiometer 24. As the reflected power input signal from sensor 26 increases, amplifier 22 will begin to produce a correspondingly increased negative output voltage that will act to disable the target voltage input signal to the amplifier 18 so that the sensor 26 effectively takes control from the amplifier 18. When the reflected power reaches the limit for safe operation, the amplifier 18, now under full control of the amplifier 22, will limit the output of generator 10 to provide a regulated reflected power level corresponding to the positioning of potentiometer 24.

Figure 2:
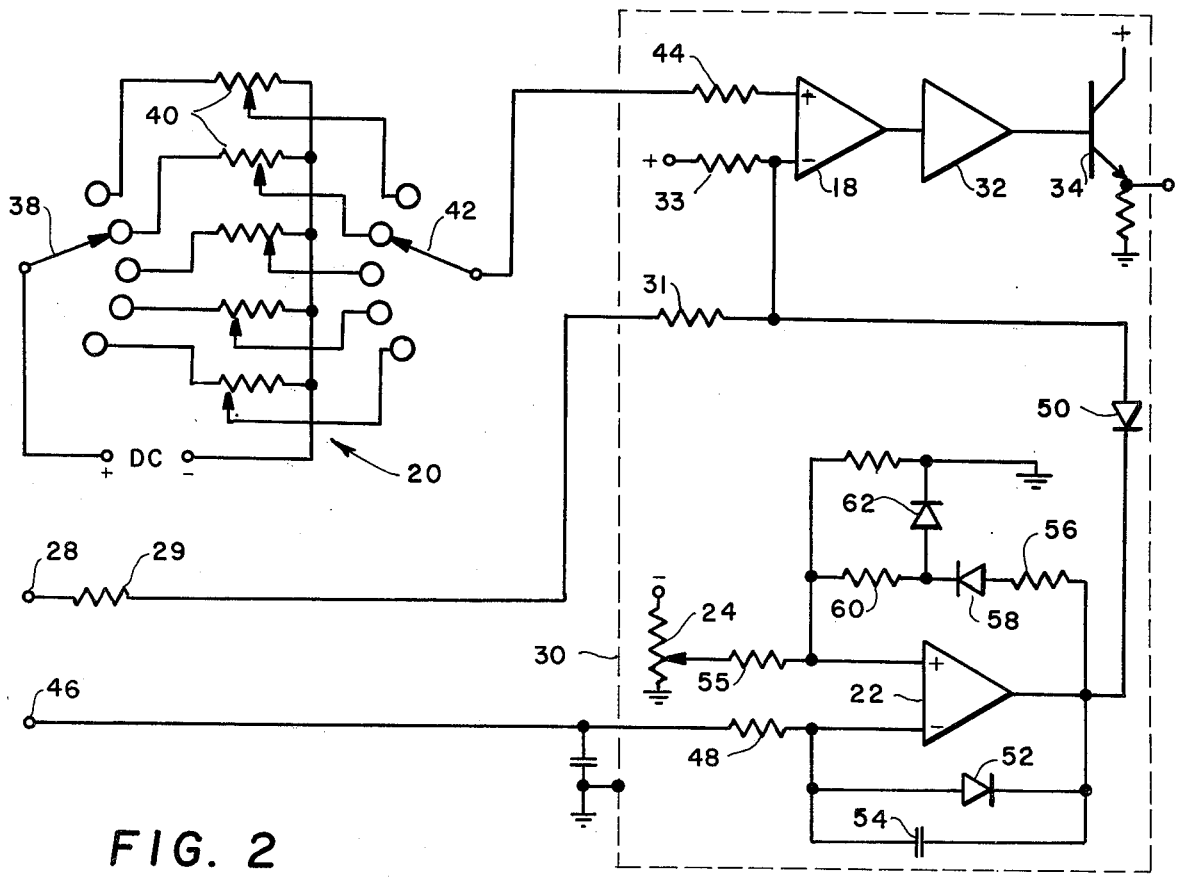
FIG. 2 is a schematic diagram of the power regulator included in the dashed lines of FIG. 1.

FIG. 2 is a schematic diagram illustrating the power regulator contained within the dashed block 16 of FIG. 1 and reference numerals of the various components within the block 16 are carried over into FIG. 2 for clarity.

In FIG. 2, the amplifier 18 receives the D.C. input signal representing R.F. voltage across the sputtering system target 12 at terminal 28 and the signal therefrom, which may be at a high D.C. level of approximately −1500 volts, is scaled down through a series resistance 29, of approximately 5 megohms, and is transmitted preferably through a coaxial cable, to a shielded box 30, and through a resistance 31, of approximately 20K, to the amplifier 18 inverting terminal which is held at a fixed positive bias via the resistance 33. Amplifier 18 may be the very popular type 741 OP AMP, the output of which is applied to the input of an amplifier 32 that outputs to the base of a high voltage NPN transistor 34, such as a type 2N5157. The collector of transistor 34 is coupled to a high voltage source of 400 to 500 volts, and the emitter is coupled to ground through a 100K resistor and to the regulator output terminal 36. As illustrated in FIG. 1, terminal 36 is coupled to the R.F. generator 10 and provides the voltage that controls the output power thereof.

The target bias voltage adjustment potentiometer 20 of FIG. 1 is illustrated in FIG. 2 as a switching arrangement by which a plurality of preadjusted bias potentiometers may be selected as desired. As shown in FIG. 2, the bias adjustment 20 comprises a 5-position, 2-pole rotary switch having a first armature 38 coupled to the positive terminal of a D.C. source of approximately 15 volts. Each of the five positions associated with the armature 38 are coupled to one end of a potentiometer 40, the other ends of which are coupled together and to the negative terminal of the above-mentioned D.C. source. Each of the rotary arms of the five bias potentiometers 40 are connected to the five contact positions associated with the second armature 42 of the 5-position, 2-pole switch, and the armature 42 is connected through a resistance 44 of approximately 20K to the non-inverting input terminal of the amplifier 18. It should be understood that the rotary switch 20 is suitable for manual operation and that if remote operation is desired, selection of the preadjusted bias potentiometers may be made by solenoid or relay switches.

The D.C. signal output of the reflected power sensor 26 of FIG. 1 is received at terminal 46 of FIG. 2 and is transmitted through a series resistance 48, of approximately 10K to the inverting terminal of the amplifier 22, which may also be a type 741 OP AMP. The output terminal of amplifier 22 is coupled to the cathode of a diode 50, the anode of which is coupled to the inverting input terminal of the amplifier 18. The inverting input of amplifier 22 is coupled to the anode of a diode 52, the cathode of which is coupled to the output terminal of the amplifier 22. The diode 52, shunted with a small capacitance 54 for frequency roll-off, operates as a negative feedback path for limiting the swing of the amplifier 22 as will be subsequently explained.

The non-inverting input terminal of amplifier 22 is coupled through a 100K resistance 55 to the adjustment arm of the reflected power limiting potentiometer 24, one terminal of which is grounded and the second terminal of which is coupled to a small negative D.C. reference source. A feedback circuit from output to non-inverting input of the amplifier 22 is provided by a 10K resistor 56 in series with diode 58 and resistance 60. One end of the resistor 56 is coupled to the output terminal of the amplifier 22, the other end is coupled to the anode of the diode 58, the cathode of which is coupled through the one megohm resistance 60 to the non-inverting input terminal of the amplifier 22. The junction of diode 58 and resistance 60 is coupled to the anode of a diode 62, the cathode of which is grounded.

In operation, D.C. signals at levels in the order of −1500 volts and representing the R.F. voltage across the target 12 are applied to the input terminal 28 where they are scaled down by the 5 megohm resistance 29 and applied to the inverting input terminal of the amplifier 18. D.C. signals from the preselected potentiometers 20 and representing the desired output of the regulator, are applied to the non-inverting input terminal of the amplifier 18 and the difference of the preselected voltage less the voltage across the target 12 is applied to amplifier 32 and transistor 34 which controls the D.C. output voltage at terminal 36 that is applied to the R.F. generator 10. Thus, without the reflected power control circuitry, the amplifier 18 operates to control the generator 10 in accordance with the positioning of the preselected potentiometers 20.

The reflected power limit potentiometer 24 is preselected to a particular value that will permit reflected power at a safe level from the target 12. Without a positive reflected power input signal at its inverting terminal, amplifier 22 will produce its full positive output signal which, when applied to the cathode of diode 50, reverse biases that diode to thereby isolate the reflected power circuit from the forward power regulator that includes the amplifier 18. The resistance 56, diodes 58 and 62 comprise a voltage divider circuit from the amplifier 22 output terminal to ground and whenever the amplifier output signal is at approximately 1.4 volts or greater, diodes 58 and 62 will conduct. The junction of diodes 58 and 62 is connected to the non-inverting input of amplifier 22 and when diode 62 is in conduction, its junction potential of approximately 0.7 volts is applied as a positive feedback to the non-inverting input to thereby maintain a positive output at the approximate power supply potential to maintain the reverse bias of diode 50 and the isolation of the reflected power circuitry from the forward power circuitry.

When an impedance mismatch occurs and the power is reflected back toward the generator 10, the reflected power sensor 26 generates a proportional D.C. output signal that is applied to the inverting input terminal of the amplifier 22. When the reflected power increases and the positive signal applied to the amplifier 22 approaches the threshold set by potentiometer 24, the amplifier output begins to swing negative to forward bias diode 50. When diode 50 conducts, amplifier 22 provides an input to amplifier 18 and disables the target input signal that previously controlled amplifier 18. During the times that the reflected power input signal is below the threshold established by potentiometer 24, the diodes 58 and 62, in conjunction with their respective resistors, serve as a positive feedback to keep diode 50 reverse biased. Once the amplifier 22 output swings negative below approximately 1.4 volts, the diodes 58 and 62 cease conduction to remove all positive feedback. It is important that positive feedback is not provided as the amplifier output proceeds to go more negative to prevent the amplifier from latching with its negative output.

When the reflected power signal applied to the inverting input of amplifier 22 begins to exceed the potentiometer 24 threshold value, the output of the amplifier goes negative and the diode 52 becomes forward biased to thereby create a condition of negative feedback causing the output of the amplifier 22 to reside at a level of approximately −0.5 volts for improving amplifier recovery time for negative excursions. The capacitor 54 in parallel with the diode 52 rolls off the frequency response of the amplifier and reduces responses to R.F. stray and noise components.

When the reflected power input signal exceeds the threshold value derived from potentiometer 24, the amplifier 22 produces a negative output to forward bias the diode 50. The forward power or target signal is now effectively short-circuited by the low impedance of the amplifier 22 and the control of amplifier 18 is completely taken over by the output of amplifier 22. Since the output of the amplifier 18 is now a function of the input signal derived from the reflected power sensor 26, the power transistor 34 will lower the output of the generator 10 to a safe level as determined by the setting of potentiometer 24.

When mismatch conditions between the generator 10 and target 12 have been corrected or improved so that the reflected power input signal to the inverting input of amplifier 22 is reduced below the threshold level established by potentiometer 24, the output signal from the amplifier 22 will swing back and latch at its high positive potential thereby causing the diode 50 to again become reverse biased to remove the reflected power circuitry from the forward power amplifier 18.

Having thus described the invention, what is claimed is:

1. Power control circuitry for controlling the power produced by an A.C. generator, the control circuitry comprising:
   first amplifier circuitry for comparing the level of a first input signal representing the A.C. voltage across the generator load and a second input signal representing one of a plurality of preselected desired output levels of said generator:
   power amplifying circuitry coupled to the output of said first amplifier circuitry for producing a power output control signal for said A.C. generator;
   second amplifier circuitry for comparing the level of a preselected threshold with a third input signal representing the power reflected from the load toward the A.C. generator; and
   switching means coupled to the output of said second amplifier circuitry and to the input of said first amplifier circuitry for removing said first input signal from said first amplifier circuitry whenever said third input signal exceeds the level of said threshold signal.

2. The power control circuitry claimed in claim 1 wherein said switching means replaces the first input signal to said first amplifier circuitry with the output level of said second amplifier circuitry whenever said third input signal exceeds the level of said threshold signal whereby said power amplifying circuitry produces an output control signal that solely is a function of said reflected power.

3. The circuitry claimed in claim 1 wherein said second amplifier circuitry includes a differential amplifier responsive to said third input signal and said threshold signal.

4. The control circuitry claimed in claim 3 wherein said second amplifier circuitry differential amplifier generates a negative output signal whenever said third input signal exceeds said threshold signal.

5. The control circuitry claimed in claim 4 wherein said first amplifier circuitry comprises a differential amplifier responsive to said first and said second input signals respectively coupled to first and second input terminals of said first amplifier circuitry differential amplifier.

6. The control circuitry claimed in claim 5 wherein said switching means comprises a diode coupled between the output terminal of said second amplifier circuitry differential amplifier and said first input terminal of said first amplifier circuitry differential amplifier, said diode becoming forward biased whenever said third input signal exceeds said threshold signal level.

7. The control circuitry claimed in claim 6 wherein said second amplifier circuitry differential amplifier includes a positive feedback circuit for latching the output of said differential amplifier at a high positive output level when said threshold signal level exceeds said third input signal.

8. The control circuitry claimed in claim 7, wherein said positive feedback circuit includes at least two series diodes coupled between the output of said second amplifier circuitry differential amplifier and a ground reference, the junction of said diodes being coupled to the threshold signal input of said second amplifier circuitry differential amplifier for maintaining a positive input thereto during conduction of said series diodes.

9. Power control circuitry for controlling the power produced by an A.C. generator comprising:
   load voltage circuitry including,
   means for generating a voltage signal representing the A.C. voltage across the load of the generator,
   a first variable voltage source,
   means for selecting a second voltage signal from said first variable voltage source representing the desired output level of said generator,
   a first amplifier means for comparing the first voltage signal and said second voltage signal and producing an output signal representing a power output control signal for controlling the output of said generator; and
   reflected voltage circuitry including,
   a second variable voltage source,
   means for selecting a voltage signal from said second variable output voltage source,
   means for generating a voltage representing the power reflected from a load connected to said generator means,
   a second amplifier means for comparing the voltage selected from said second variable source and the voltage representing the power reflected from said load for generating a reflected power output signal,
   switching means coupled to the output of said second circuitry and to the input of said first circuitry for rendering said first circuit inoperative when and for so long as said reflected power output signal exceeds the selected value from voltage signal from said second variable voltage source.

* * * * *

UNITED STATES PATENT AND TRADEMARK OFFICE
CERTIFICATE OF CORRECTION

PATENT NO. : 4,287,466
DATED : Sep. 1, 1981
INVENTOR(S) : Donald L. Quick

It is certified that error appears in the above–identified patent and that said Letters Patent are hereby corrected as shown below:

Column 2, line 53, change "Bird Electronic Corporation" to --Bird Electric Corporation--.

Signed and Sealed this

Ninth Day of February 1982

[SEAL]

Attest:

GERALD J. MOSSINGHOFF

Attesting Officer

Commissioner of Patents and Trademarks